(12) United States Patent
Benzer (10) Patent No.: US 7,119,616 B2
(45) Date of Patent: Oct. 10, 2006

(54) METHOD AND APPARATUS FOR A FULLY DIFFERENTIAL AMPLIFIER OUTPUT STAGE

(75) Inventor: Darrin R. Benzer, Chandler, AZ (US)

(73) Assignee: Broadcom Corporation, Irvine, CA (US)

( * ) Notice: Subject to any disclaimer, the term of this patent is extended or adjusted under 35 U.S.C. 154(b) by 6 days.

(21) Appl. No.: 10/940,119

(22) Filed: Sep. 14, 2004

(65) Prior Publication Data

US 2006/0017503 A1    Jan. 26, 2006

Related U.S. Application Data

(60) Provisional application No. 60/590,447, filed on Jul. 23, 2004.

(51) Int. Cl.
*G06G 7/12* (2006.01)
*H03G 5/16* (2006.01)
(52) U.S. Cl. ............. 330/252; 330/253; 330/255; 330/277; 330/257; 330/258; 330/269; 330/285; 330/261; 330/133; 330/311; 327/563
(58) Field of Classification Search ........ 330/252, 330/253, 255, 277, 257, 269, 258, 285, 261, 330/133, 311; 327/563
See application file for complete search history.

(56) References Cited

U.S. PATENT DOCUMENTS 5,446,412 A * 8/1995 Kimyacioglu et al. ...... 330/255

OTHER PUBLICATIONS

Holt Electronic Circuit Digital and Analog John Wiley and Sons 1978 p. 637.*

* cited by examiner

*Primary Examiner*—Michael Shingleton
(74) *Attorney, Agent, or Firm*—McAndrews, Held & Malloy, Ltd.

(57) ABSTRACT

The input stage of the fully differential amplifier output stage is configured in a differential pair configuration with a tail current. The tail current is divided between two legs of the input stage and is higher in the leg that has the higher of the two input voltage levels (in or inb). The devices in each leg of the fully differential amplifier output stage may be cascoded to avoid electrical voltage overstress. The top device in each leg of the differential input stage may be coupled in a diode configuration and is utilized to mirror the current into another NMOS current mirror as well as to a PMOS output device. The gate of the PMOS output devices are connected in a cross-coupled configuration. The NMOS current mirrors are utilized to mirror the current into the NMOS output devices in a non-cross-coupled configuration.

58 Claims, 3 Drawing Sheets

METHOD AND APPARATUS FOR A FULLY DIFFERENTIAL AMPLIFIER OUTPUT STAGE

CROSS-REFERENCE TO RELATED APPLICATIONS/INCORPORATION BY REFERENCE

This application makes reference to, claims priority to, and claims the benefit of U.S. Provisional Application Ser. No. 60/590,447 filed Jul. 23, 2004.

The above stated application is hereby incorporated herein by reference in its entirety.

FIELD OF THE INVENTION

Certain embodiments of the invention relate to differential amplifiers. More specifically, certain embodiments of the invention relate to a method and apparatus for a fully differential amplifier output stage.

BACKGROUND OF THE INVENTION

A transistor is an electronic device that permits current flow in electronic circuits. In this regard, the transistor permits the current to flow in a controlled manner whenever an electronic circuit attempts to push current through the transistor. In this manner, the transistor generically operates as a regulator or valve, which regulates the flow of current.

In order to mitigate the effects of impairments such as noise, transistors may be arranged so that they form a differential amplifier. Differential amplifiers form the basis of operational amplifiers, the latter of which are generally referred to as op amps. Differential amplifiers are electronic circuits, which are designed with an internal symmetry that is configured to cancel errors that are shared by both sides of the differential amplifier. These errors may include internal or external errors. Internal errors may include temperature changes, which in certain instances may affect both sides of the operational amplifier to approximately the same degree. Transistor mismatch is another example of an internal error. Whenever both sides are affected to approximately the same degree, a nulling or canceling effect occurs. External errors may include noise picked up by inputs of the differential amplifier. In this regard, the differential amplifier may be adapted to eliminate common mode noise. Furthermore, the differential amplifier may require that the signal appear as a difference between waveforms occurring on either side of the differential amplifier. Accordingly, the differential amplifier may be configured to reject certain signal components such as noise and amplify desired signal components.

Some conventional differential amplifiers require a reference voltage or reference current in order for the differential amplifier to operate properly. Additionally, some differential amplifier designs utilize large numbers of transistors. In general, the greater the number of transistor devices, the greater the number of operating variables that will vary with respect to each of the sides of a differential amplifier. Consequently, differential amplifiers that utilize a large number of transistors may be more difficult to control and tune, and may also be less predictable with respect to process or operating variations. Furthermore, most conventional analog differential amplifiers are generally adapted to take a relatively small differential input voltage and produce as an output a voltage having a larger magnitude. These conventional analog differential amplifiers are usually optimized to operate in a specified voltage range and may not function at all if operated outside that range.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Aspects of the invention may provide a system and method for a fully differential amplifier output stage. In one system embodiment of the invention, a transistor circuit may include an input stage, a first output stage and a second output stage. The input stage may comprise a first current source electrically connected to a first transistor by either directly or via a resistor. A second transistor may be directly electrically connected to the first transistor. A third transistor may be electrically connected to the first current source either directly or via a resistor. A fourth transistor may be electrically connected to the third transistor.

The first output stage may comprise a fifth transistor directly electrically connected to the second transistor in a current mirror configuration. A sixth transistor may be electrically connected to the fifth transistor. A seventh transistor may be directly electrically connected to the sixth transistor in a current mirror configuration. An eighth transistor may be electrically connected to the seventh transistor. The second output stage may comprise a ninth transistor directly electrically connected to the fourth transistor in a current mirror configuration. A tenth transistor may be electrically connected to the ninth transistor. An eleventh transistor may be directly electrically connected to the tenth transistor in a current mirror configuration. A twelfth transistor may be electrically connected to the eleventh transistor.

A first input may be directly electrically connected to a gate of the first transistor and a second input may be directly electrically connected to a gate of the third transistor. A first output may be directly electrically connected to a drain of the twelfth transistor and to a drain of the eleventh transistor, and a second output may be directly electrically connected a drain of the eighth transistor and to a drain of seventh transistor. In addition, the second transistor may be electrically connected to the twelfth transistor either directly or via a resistor, and the fourth transistor may be electrically connected to the eighth transistor either directly or via a resistor. The first input and the second input may be complementary inputs and the first output and the second output may be complementary outputs. In addition, a higher voltage potential of an external power source may be supplied to a source of each of the second transistor, the fourth transistor, the fifth transistor, the eighth transistor, the ninth transistor, and the twelfth transistor, all of which may be PMOS transistors. A lower voltage potential of an external power source may be supplied to a source of each of the sixth transistor, the seventh transistor, the tenth transistor, the eleventh transistor and the first current source. The first transistor, the third transistor, the sixth transistor, the seventh transistor, the tenth transistor, the eleventh transistor and the first current source may be NMOS transistors.

A drain of the first current source may be directly electrically connected to a source of the first transistor and to a source of the third transistor. A first terminal of a first resistive device may be directly electrically connected to a drain of the first current source and a second terminal of the first resistive device may be directly electrically connected to a source of the first transistor and to a source of the third transistor. A gate of the second transistor may be directly electrically connected to a drain of the second transistor, to a drain of the first transistor, to a gate of the fifth transistor, and to a gate of the twelfth transistor. A first terminal of a second resistive device may be directly electrically connected to a gate of the second transistor, to a drain of the second transistor, to a drain of the first transistor, and to a gate of the fifth transistor and the second terminal of the second resistive device may be directly electrically connected to a gate of the twelfth transistor. A gate of the fourth transistor may be directly electrically connected to a drain of the fourth transistor, to a drain of the third transistor, to a gate of the ninth transistor, and to a gate of the eighth transistor.

In addition, a first terminal of a third resistive device may be directly electrically connected to a gate of the fourth transistor, to a drain of the fourth transistor, to a drain of the third transistor, and to a gate of the ninth transistor. The second terminal of the third resistive device may be directly electrically connected to a gate of the eighth transistor. A gate of the sixth transistor may be directly electrically connected to a drain of the sixth transistor, to a drain of the fifth transistor, and to a gate of the seventh transistor. A gate of the tenth transistor may be directly electrically connected to a drain of the tenth transistor, to a drain of the ninth transistor, and to a gate of the eleventh transistor.

A first pull-down device, which may be a NMOS transistor, may be directly electrically connected to the fifth transistor, to the sixth transistor, and to the seventh transistor. A lower voltage potential of an external power source may be supplied to a source of the first pull-down device, and a drain of the first pull-down device may be directly electrically connected to a drain of the fifth transistor, to a gate of the sixth transistor, and to a gate of the seventh transistor. A second pull-down device, which may be a NMOS transistor, may be directly electrically connected to a ninth transistor, to a tenth transistor, and to an eleventh transistor. A lower voltage potential of the external power source may be directly electrically connected to a source of the second pull-down device, and a drain of the second pull-down device may be directly electrically connected to a drain of the ninth transistor, to a gate of the tenth transistor, and to a gate of the eleventh transistor.

A first pull-up device, which may be a PMOS transistor, may be electrically connected to the third transistor, the fourth transistor, the eighth transistor, and the ninth transistor. A higher voltage potential of the external power source may be supplied to a source of the first pull-up device. A drain of the first pull-up device may be directly electrically connected to a drain of the third transistor, to a gate of the fourth transistor, to a drain of the fourth transistor, to a gate of the eighth transistor and to a gate of the ninth transistor. In an alternate embodiment, a higher voltage potential of the external power source may be supplied to a source of the first pull-up device, which may be a PMOS transistor. A drain of the first pull-up device may be directly electrically connected to a gate of the eighth transistor and to a first terminal of a third resistive device. The second terminal of the third resistive device may be directly electrically connected to a gate of the fourth transistor, to a drain of the fourth resistor, and to a gate of the ninth transistor.

A second pull-up device, which may be a PMOS transistor, may be electrically connected to the first transistor, to the second transistor, to the fifth transistor and to the twelfth transistor. A higher voltage potential of the external power source may be supplied to a source of the second pull-up device. A drain of the second pull-up device may be directly electrically connected to a drain of the first transistor, to a gate of the second transistor, to a drain of the second transistor, to a gate of the fifth transistor and to a gate of the twelfth transistor. In another embodiment, a higher voltage potential of the external power source may be supplied to a source of the second pull-up device, which may be a PMOS. A drain of the second pull-up device may be directly electrically connected to a gate of the twelfth transistor and to a first terminal of a second resistive device. A second terminal of the second resistive device may be directly electrically connected to a drain of the first transistor, to a gate of the second transistor, to a drain of the second transistors and to a gate of the fifth transistor.

In accordance with another embodiment of the invention, at least one transistor may be electrically connected between the first transistor and the second transistor in a cascode arrangement. At least one transistor may be electrically connected between the third transistor and the fourth transistor in a cascode arrangement and at least one transistor may be electrically connected between the fifth transistor and the sixth transistor in a cascode arrangement. At least one transistor may be electrically connected between the seventh transistor and the eighth transistor in a cascode arrangement and at least one transistor may be electrically connected between the ninth transistor and the tenth transistor in a cascode arrangement. At least one transistor may also be electrically connected between the eleventh transistor and the twelfth transistor in a cascode arrangement.

A thirteenth transistor and a fourteenth transistor may be electrically connected between the first transistor and the second transistor, and the thirteenth transistor may be an NMOS transistor and the fourteenth transistor may be a PMOS transistor. The thirteenth transistor and the first transistor may be cascoded, and the fourteenth transistor may be directly electrically connected with the second transistor and the thirteenth transistor. A fifteenth transistor and a sixteenth transistor may be electrically connected between the third transistor and the fourth transistor, and the fifteenth transistor may be an NMOS transistor and the sixteenth transistor may be a PMOS transistor. The fifteenth transistor and the third transistor may be cascoded, and the sixteenth transistor may also be directly electrically connected with the fourth transistor and the fifteenth transistor.

A seventeenth transistor and an eighteenth transistor may be electrically connected between the fifth transistor and the sixth transistor, and the seventeenth transistor may be an NMOS transistor and the eighteenth transistor may be a PMOS transistor. The fifth transistor and the eighteenth transistor may be cascoded, and the seventeenth transistor may be directly electrically connected with the sixth transistor and the eighteenth transistor. A nineteenth transistor and a twentieth transistor may be electrically connected between the seventh transistor and the eighth transistor, and the nineteenth transistor may be an NMOS transistor and the twentieth transistor may be a PMOS transistor. The nineteenth transistor and the seventh transistor may be cascoded, and the eighth transistor and the twentieth transistor may also be cascoded.

A twenty-first transistor and a twenty-second transistor may be directly electrically connected between the ninth transistor and the tenth transistor, and the twenty-first transistor may be an NMOS transistor and the twenty-second transistor may be a PMOS transistor. The ninth transistor and the twenty-second transistor may be cascoded, and the tenth transistor and the twenty-first transistor may be directly electrically connected. A twenty-third transistor and a twenty-fourth transistor electrically connected between the eleventh transistor and the twelfth transistor, and the twenty-third transistor may be an NMOS and the twenty-fourth transistor may be a PMOS. The twelfth transistor and the twenty-fourth transistor may be cascoded, and the twenty-third transistor and the eleventh transistor may be cascoded.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and apparatus for a fully differential amplifier output stage. In accordance with an embodiment of the invention, the fully differential amplifier output stage may comprise an input stage and two output stages. The input stage, which may also be referred to as a differential input stage, may be adapted to receive differential input signals (in and inb) and generate two differential output signals (out and outb) at the output stages.

The differential input stage may be configured in a differential pair configuration with a tail current. The tail current may be divided between two legs of the input stage and may be higher in the leg that may have the higher of the two input voltage levels of in or inb. In accordance with an aspect of the invention, the devices in each leg of the fully differential amplifier output stage may be cascoded to avoid electrical voltage overstress. The top device in each leg of the differential input stage may be coupled in a diode configuration and may be utilized to mirror the current into another NMOS current mirror as well as to a PMOS output device. The gates of the PMOS output devices may be connected in a cross-coupled configuration. The NMOS current mirrors may be utilized to mirror the current into the NMOS output devices in a non-cross-coupled configuration. Since there may be a longer delay to the NMOS output devices due to the additional mirroring stage, resistors may be utilized between the P-diodes of the differential input stage and the gates of the PMOS output devices. This may create an RC time constant that may delay the turn-on time of the PMOS output devices which may provide improved propagation delay matching.

Figure 1:
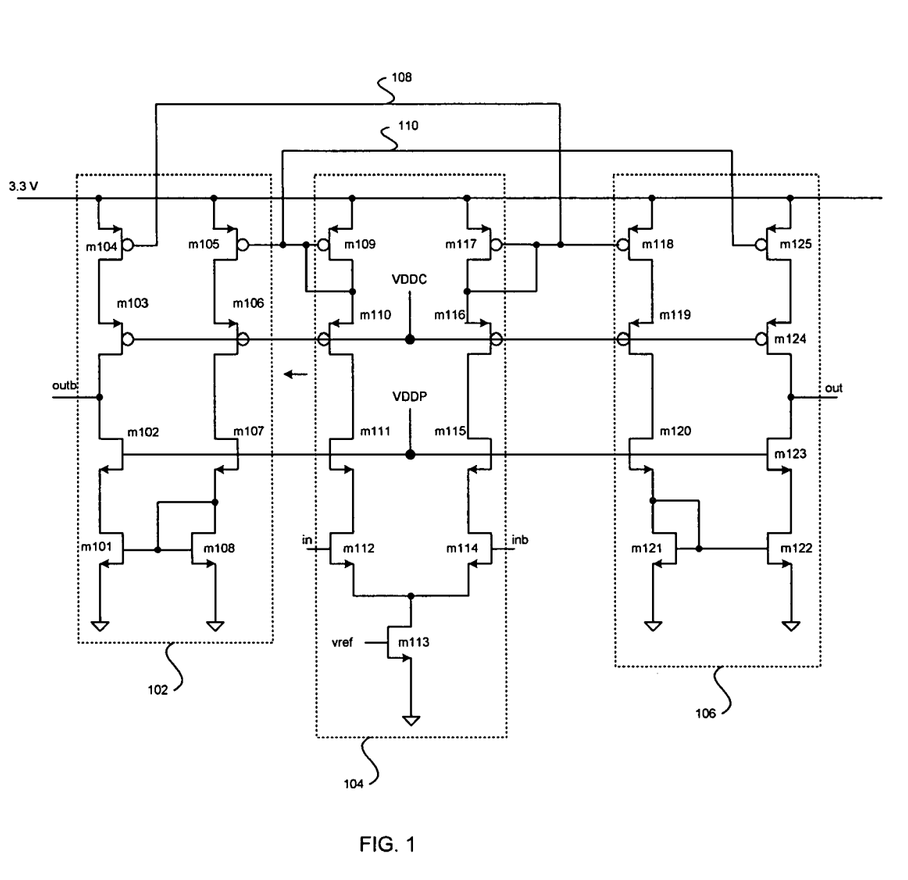
FIG. 1 is a block diagram of an exemplary system for a fully differential amplifier output stage, in accordance with an embodiment of the invention.

FIG. 1 is a block diagram of an exemplary system for a fully differential amplifier output stage In accordance with an embodiment of the invention. Referring to FIG. 1, the amplifier comprises an input stage 104, a first output stage 102 and a second output stage 106. Transistors m103, m104, m105, m106 in the first output stage 102 may be PMOS transistors and transistors ml, m2, m7, m8 In the first output stage may be NMOS transistors. In the second output stage 106, transistors m118, m119, m124, m125 may be PMOS transistors and transistors m120, m121, m122, m123 may be NMOS transistors. In the differential input age 104, transistors m109, m110, m116, and m117 may be PMOS transistors and transistors m111, m112, m113, m114, m115 may be NMOS transistors.

The source of each of transistors m104, m105, m109, m117, m118, m125 may be tied to, for example, a 3.3 v source. The source of each of transistors m101, m108, m113, m121 and m122 may be tied to ground. Transistors m109 and m117 in the differential input age may function as diode current mirrors that may mirror the current from a corresponding leg of the input stage 104 over to a corresponding lag of each of the output stages 102, 106. Transistor m108 in the first output age 102 functions as a diode current mirror and transistor m121 in the second output age 106 also functions as a diode current mirror. Transistor m113 may be configured as the current source for the differential input age.

In instances when input signal "in" may be greater than input signal "inb," then current flows through transistors m112, m111, m110, and m109. Throughout this disclosure, whenever a first signal is described as being greater than a second signal, this means that the first signal is sufficiently high enough to steer a current in a leg of the amplifier that is associated with the first signal. Since the gates of transistor m105 and m109 may be coupled, current may be mirrored from transistor m109, which may be configured as a current mirror, to transistor m105 and flows through transistors m106, m107 and m108. Since the current in transistor m108 may be mirrored to transistor m101, current may flow through transistor m101 and transistor m102 thereby pulling the output "outb" low. Since input "in" may be greater than input "inb," then there may be negligible current in transistors m114 m115 m116 and m117 of the right leg of the differential input stage 104. Also, since the gate of transistor m117 may be mirrored to transistor m104 via coupling 108, minimal current may flow in transistors m104 and m103.

Since the gate of transistor m117 may be mirrored to transistor m118, a minimal current may flow through transistors m118, m119 m120, and m121. Furthermore since the gates of transistors m121 and m122 may be coupled, a minimal current may be mirrored from transistor m121 which may be configured as a current mirror, to transistor m122. Therefore, a minimal amount of current may flow through transistor m123. Transistor m109 may mirror current to transistor m125 and the mirrored current may flow through transistors m125 and m124 thereby pulling the output "out" high.

In instances when input signal "inb" is greater than input signal "in," then current may flow through transistors m114, m115, m116, and m117. Since the gates of transistor m117 and m118 may be coupled, current may be mirrored from transistor m117, which may be configured as a current mirror, to transistor m118 and may flow through transistors m119, m120 and m121. Since the current in transistor m121 may be mirrored over to transistor m122, current may flow through transistor m122 and transistor m123, thereby pulling output "out" low. Since input "inb" is greater than input "in," then there may be negligible current in transistors m112, m111, m110, and m109 of the left leg of the differential input stage 104. Also, since the output of transistor m109 may be mirrored to transistor m125 via coupling 110, minimal current may flow in transistor m125 and transistor m124.

Since the gate of transistor m109 may be mirrored to transistor m105, a minimal current may flow through transistors m105, m106, m107, and m108. Furthermore, since the gates of transistors m108 and m101 may be coupled, a minimal current may be mirrored from transistor m108, which may be configured as a current mirror, to transistor m101. Therefore, a minimal amount of current may flow through transistor m102. Transistor m117 may mirror current to transistor m104, and the mirrored current may flow through transistors m104 and m103, thereby pulling the output "outb" high.

In accordance with an embodiment of the invention, with reference to FIG. 1, the fully differential amplifier output stage may comprise input stage 104 and two output stages 102 and 106. The differential input stage 104 may be adapted to receive differential input signals "in" and "inb" and generate two differential output signals "out" and "outb" at the output stages. The differential input stage 104 may be configured in a differential pair configuration with a tail current generated by transistor m113. In this regard, transistor m113 may be a current source. The tail current that may be generated by the transistor m113 may be divided between a left leg and a right leg of the input stage 104 and may be higher in the leg that may have the higher of the two input voltage levels (in or inb). For example, if input "in" is logic 1 and input "inb" is logic 0, then a majority of current will flow in the left leg of the differential input stage 104. However, if the input "inb" is logic 1 and input "in" is logic 0, then a majority of current may flow in the right leg of the differential input stage 104.

In accordance with an aspect of the invention, the transistors in each leg of the fully differential amplifier stages 102, 104, 106 may be cascoded to avoid electrical voltage overstress. The top device in each leg of the differential input stage 104 may be coupled in a diode configuration and may be utilized to mirror the current into another NMOS current mirror as well as to a PMOS output device. The gate of the PMOS output devices may be connected in a cross-coupled configuration. The NMOS current mirrors may be utilized to mirror the current into the NMOS output devices in a non-cross-coupled configuration.

Figure 3:
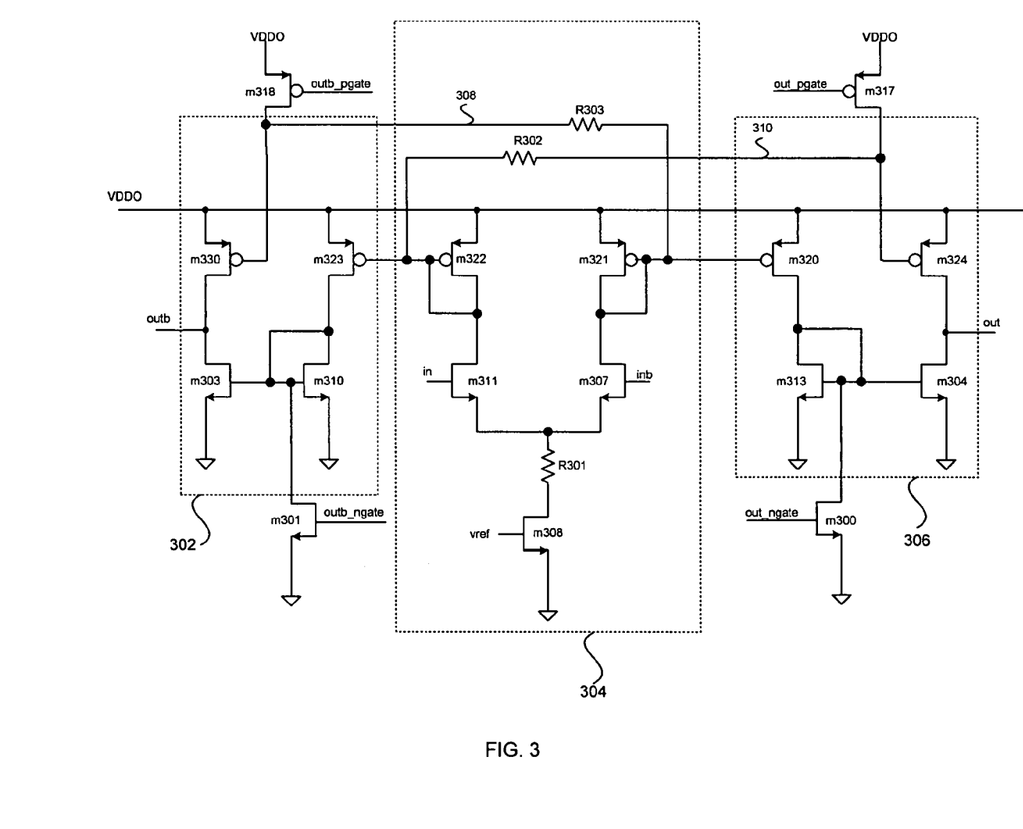
FIG. 3 is a block diagram illustrating the fully differential amplifier output stage of FIG. 1 without cascoded devices, in accordance with an embodiment of the invention.

In the fully differential amplifier output stage of FIG. 1, the transistors may be cascoded to ensure that 3.3v may not be seen at the junctions of the devices. For example, in the first output stage 102, transistors m102, m103, m106, and m107 are cascoded to ensure voltage standoff. Similarly, transistors m110, m111, m115 and m116 in the differential input stage 104 and transistors m119, m120, m123 and m124 are cascoded to ensure voltage standoff in the second output stage 106. Accordingly, it should be recognized that the transistors m102, m103, m106, m107, m110, m111, m115, m116, m119, m120, m123, and m124 may be eliminated if the appropriate voltage may be applied without departing from the various aspects of the invention. FIG. 3 illustrates an embodiment of the invention without cascoded devices.

Figure 2:
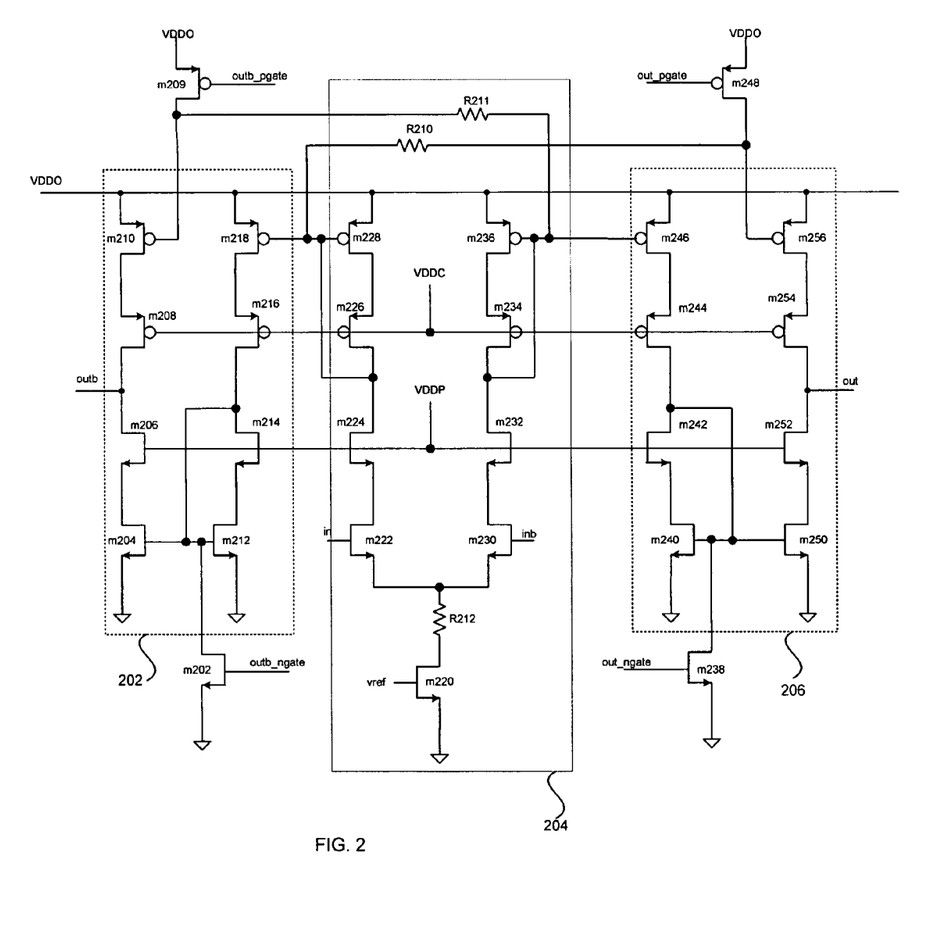
FIG. 2 is a block diagram illustrating the fully differential amplifier output stage of FIG. 1 with cascoded devices for voltage standoff, in accordance with an embodiment of the invention.

FIG. 2 is a block diagram illustrating the fully differential amplifier output stage of FIG. 1 with cascoded devices for voltage standoff, in accordance with an embodiment of the invention. Referring to FIG. 2, there is shown a differential input stage 204, a first output stage 202 and a second output stage 206. The differential input stage 204 comprises a left leg, a right leg and a current source m220. The left leg of the differential input stage 204 comprises transistors m222, m224, m226, m228 and the right leg of the differential input stage 204 comprises transistors m230, m232, m234 and m236. The inputs to the differential input stage 204 may be "in" which may be coupled to transistor m222 and "inb" which may be coupled to transistor m230. In the differential input stage 204, transistors m226 and m228 function as a diode current mirror and transistors m234 and m236 also function as a diode current mirror.

The first output stage 202 may comprise a left leg and a right leg. The left leg of the first output stage 202 may comprise transistors m204, m206, m208, m210 and the right leg of the first output stage 202 may comprise transistors m212, m214, m216, and m218. In the first output stage 202, transistors m214 and m212 may function as a diode current mirror.

The second output stage 206 may comprise a left leg and a right leg. The left leg of the second output stage 206 may comprise transistors m240, m242, m244, m246 and the right leg of the second output stage 206 may comprise transistors m250, m252, r254, and m256. In the second output stage 206, transistors m242 and m240 may function as a diode current mirror.

In operation, if the input "in" is greater than "inb", then transistor m220 may sink current through the left leg of the differential input stage 204 through transistors m222, m224, m226, and m228. The current from transistor m228 may be mirrored to transistor m218 and may flow through transistors m216, m214 and m212. The current from transistor m212 may be mirrored to transistor m204 and may flow through transistor m206 to the output "outb." Since transistor m210 may be turned off, output "outb" may be pulled low. Since the input "in" is greater than "inb", then there may be minimal current in transistors m230, m232, m234 and m236 of the right leg of the differential input stage 204. Also, since the gate of the transistor m236 may be mirrored to transistor m210 via coupling 208, then minimal current may flow in transistors m210 and transistor m208.

Since the gate of transistor m236 may be mirrored to transistor m246, a minimal current may flow through transistors m246, m244, m242, and m240. Furthermore since the gates of transistors m240 and m250 may be coupled, a minimal current may be mirrored from transistor m240, which may be configured as a current mirror, to transistor m250. Therefore, a minimal amount of current may flow through transistor m252. Transistor m228 may mirror current to transistor m256, and the mirrored current may flow through transistors m256 and m254, thereby pulling the output pad "out" high.

FIG. 2 further comprises a plurality of transistors, namely m202, m238 m248 and m209 that may be utilized to mitigate the effects of a leakage current due to a mismatch in the transistors. The gates of each of the transistors m202, m238, m248 and m209 may be controlled by logic which turns these transistors on and off based on the differential input signals "in" and "inb." In the case where input "in" is greater than input "inb" and current may be mirrored in the left leg resulting in pad "outb" being pulled low, transistor m209 may be turned on to pull the gate of transistor m210 high in order to make sure that there may be minimal current flowing in transistors m210 and m209. Simultaneously, transistor m202 may be off. Similarly, for this case, output "out" may be pulled high and transistor m238 may be turned on to pull the gate of transistor m250 low in order to ensure that there may be minimal current flowing in transistors m250 and m252. Simultaneously, transistor m248 may be off.

In the case where input "inb" is greater than input "in" and current may be mirrored in the right leg resulting in pad "out" being pulled low, transistor m248 may be turned on to pull the gate of transistor m256 high in order to make sure that there may be no current flowing in transistors m256 and m254. Simultaneously, transistor m238 may be off. Similarly, for this case, output "outb" may be pulled high and transistor m202 may be turned on to pull the gate of transistor m204 low in order to ensure that there may be minimal current flowing in transistors m204 and m206. Simultaneously, transistor m209 may be off.

In operation, if the input "inb" is greater than "in" then transistor m220 may sink current via coupling R212 through the right leg of the differential input stage 204 through transistors m230, m232, m234, and m236. The current from transistor m236 may be mirrored to transistor m246 and flows through transistors m246, m244, m242 and m240. The current from transistor m240 may be mirrored to transistor m250 and may flow through transistor m252 to the output pad "out." Since transistor m256 may be turned off, output "out" may be pulled low. Since the input "inb" is greater than "in" then there may be negligible current in transistors m222, m224, m226 and m228 of the left leg of the differential input stage 204. Also, since the gate of transistor m228 may be mirrored to transistor m256 via coupling R210, then minimal current may flow in transistors m256 and m254.

In operation, if the input "in" is greater than "inb" then transistor m220 may sink current via coupling R212 through the left leg of the differential input stage 204 through transistors m222, m224, m226, and m228. The current from transistor m228 may be mirrored to transistor m218 and may flow through transistors m218, m216, m214 and m212. The current from transistor m212 may be mirrored to transistor m204 and may flow through transistor m206 to the output "outb." Since transistor m210 may be turned off, output "outb" may be pulled low. Since the input "in" is greater than "inb", then there may be negligible current in transistors m230, m232 m234 and m236 of the right leg of the differential input stage 204. Also, since the gate of transistor m236 may be mirrored to transistor m210 via coupling R211, then minimal current may flow in transistors m210 and m208.

FIG. 3 is a block diagram illustrating the fully differential amplifier output stage of FIG. 1 without cascoded devices, in accordance with an embodiment of the invention. Referring to FIG. 3, there is shown a differential input stage 304, a first output stage 302 and a second output stage 306. The differential input stage 304 may comprise a left leg, a right leg and a current source transistor m308. The left leg of the differential input stage 304 may comprise transistors m311, m322, and the right leg of the differential input stage 304 may comprise transistors m307 and m321. The inputs to the differential input stage 304 may be "in" which may be coupled to a gate of transistor m311 and "inb" which may be coupled to a gate of transistor m307. In the differential input stage 304, transistor m322 may function as a diode current mirror and transistor m321 also may function as a diode current mirror.

The first output stage 302 may comprise a left leg and a right leg. The left leg of the first output stage 302 may comprise transistors m330 m303 and the right leg of the first output stage 302 may comprise transistors m323 and m310. In the first output stage 302, transistor m310 may function as a diode current mirror that mirrors current from transistor m323 to transistor m303.

The second output stage 306 may comprise a left leg and a right leg. The left leg of the second output stage 306 may comprise transistors m320 m313 and the right leg of the second output stage 306 may comprise transistors m324 and m304. In the second output stage 306, transistor m313 may function as a diode current mirror that mirrors current from transistor m320 to transistor m304.

In operation, if the input "in" is greater than "inb", then transistor m308 may sink current via coupling R301 through the left leg of the differential input stage 304 through transistors m311 and m322. The current from transistor m311 may be mirrored to transistor m323 and may flow through transistor m310. The current from transistor m310 may be mirrored to transistor m303 and may flow through transistor m303 to the output pad "outb." Since transistor m330 may be turned off, "outb" may be pulled low. Since the input "in" is greater than the input "inb", then there may be minimal current in transistors m307 and m321 of the right leg of the differential input stage 304. Also, since the current of transistor m321 may be mirrored to transistor m330 via coupling 308, then minimal current may flow in transistor m330.

Since the current of transistor m321 may be mirrored to transistor m320, a minimal current will flow through transistors m320 and m313. Furthermore since the gates of transistors m313 and m304 may be coupled, a minimal current may be mirrored from transistor m313, which may be configured as a current mirror, to transistor m304. Since transistor m322 may mirror current to transistor m324 via coupling 310, the mirrored current may flow through transistor m324, thereby pulling the output pad "out" high.

In operation, if the input "inb" is greater than "in", then transistor m308 may sink current via coupling R301 through the right leg of the differential input stage 304 through transistors m307 and m321. The current from transistor m321 may be mirrored to transistor m320 and may flow through transistor m313. The current from transistor m313 may be mirrored to transistor m304 and may flow through transistor m304 to the output "out." Since transistor m324 may be turned off, "out" pulls low. Since the input "inb" is greater than "in", then there may be minimal current in transistors m311 and m322 of the left leg of the differential input stage 304. Also, since the current of the transistor m322 may be mirrored to transistor m324 via coupling 310, then minimal current may flow in transistor m324.

Since the current of transistor m322 may be mirrored to transistor m323, a minimal current will flow through transistors m323 and m310. Furthermore since the gates of transistors m310 and m303 may be coupled, a minimal current may be mirrored from transistor m310, which may be configured as a current mirror, to transistor m303. Since transistor m321 may mirror current to transistor m330 via coupling 308, the mirrored current may flow through transistor m330, thereby pulling the output "outb" high.

In accordance with an embodiment of the invention, the invention may be implemented in a completely complementary fashion by replacing the NMOS transistors with PMOS transistors and the PMOS transistors with NMOS transistors, and reversing the power and ground connections. In this regard, transistors m103, m104, m105, m106 in the first output stage 102 may be NMOS transistors and transistors m101, m102, m107, m108 in the first output stage 102 may be PMOS transistors. In the second output stage 106, transistors m118, m119, m124, m125 may be NMOS transistors and transistors m120, m121, m122, m123 may be PMOS transistors. In the differential input stage 104, transistors m109, m110, m116, and m117 may be NMOS transistors and transistors m111, m112, m113, m114, m115 may be PMOS transistors. Additionally, there are also variations of the input stage that may be implemented, which may include, but is not limited to, a fully complementary (NMOS and PMOS) differential input stage. Although not shown, diodes may be added to the output to mitigate the effects of electrostatic discharge (ESD). For example, in FIG. 3, one or more diodes may be coupled to the outputs "out" and "outb." The arrangement of FIGs. 1–3 may also be implemented utilizing bipolar technology. It should also be recognized by one skilled in the art that other type of current mirrors may also be utilized without departing from the various aspects of the invention.

With reference to FIG. 1, when input signal "in" is high, as soon as transistor m109 starts mirroring the current, transistor m125 will start pulling the output signal "out" high. Additional time may be required for the current to be mirrored from transistor m109 to transistor m105 and the current from transistor m105 to be mirrored by transistor m108 to transistor m10. Since there may be additional delay for the current to be mirrored from transistor m109 to transistor m105 to transistor m108 to transistor m10 to the output "outb," a resistor may be added to path 110 to compensate for this propagation delay by introducing a RC delay to delay the turning on of transistor m125. Accordingly, FIG. 3, for example, illustrates a resistor R302 in path 310, which provides compensation for the propagation delay when current may be mirrored from m322 to m323 to m310 to m303 to the output "outb." In this regard, the resistor R302 may delay the turning on of transistor m324.

Similarly, with reference to FIG. 1, in the second output stage 106, additional time may be required for the current to be mirrored from transistor m117 to transistor m118 and the current from transistor m118 to be mirrored by transistor m121 to transistor m122. Since there may be additional delay for the current to be mirrored from transistor m117 to transistor m118 to transistor m121 to transistor m122 to the output "out," a resistor may be added to path 108 to compensate for this propagation delay by introducing a RC delay to delay the turning of transistor m104. Accordingly, FIG. 3, for example, illustrates a resistor R303 in path 308, which may provide compensation for the propagation delay when current may be mirrored from m321 to m320 to m313 to m304 to the output "out." In this regard, the resistor R303 may delay the turning on of transistor m330.

Referring to FIG. 1, in instances where the input signal "in" is greater than its complement "inb" and there may be a minimal current flowing through transistors m114, m115, m116, and m117, and the minimal amount of current flowing may cause the gate of the transistor m117 to bias to the point where it may start to conduct in order to supply the leakage current. Accordingly, if there is a mismatch between transistor m117, and transistors m118 and m104, then transistor m117 may potentially mirror a significant amount of current to transistors m118 and m104. To prevent this potential mirroring of a significant amount of current, the gate of transistor m117 may need to be pulled up to the 3.3 v supply in order to ensure that transistors m117 m118 and m104 may be off. Accordingly, in FIG. 2, for example, transistors m202, m238 m248, and m209 ensure that there may be no leakage current by shutting off the transistors.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A transistor circuit, comprising:
an input stage, said input stage comprising:
a first current source electrically connected to a first transistor via one of the following: a direct electrical connection, and a direct electrical connection from said first current source to a first terminal of a first resistive device and a direct electrical connection from a second terminal of said first resistive device to said first transistor;
a second transistor electrically connected to said first transistor;
a third transistor electrically connected to said first current source via one of the following: a direct electrical connection, and a direct electrical connection from said first current source to a first terminal of said first resistive device and a direct electrical connection from a second terminal of said first resistive device to said third transistor; and
a fourth transistor electrically connected to said third transistor;
a first output stage, said first output stage comprising:
a fifth transistor directly electrically connected to said second transistor, wherein said second transistor and said fifth transistor are configured as a current mirror;
a sixth transistor electrically connected to said fifth transistor;
a seventh transistor directly electrically connected to said sixth transistor, wherein said sixth transistor and said seventh transistor are configured as a current mirror; and
an eighth transistor electrically connected to said seventh transistor;
a second output stage, said second output stage comprising:
a ninth transistor directly electrically connected to said fourth transistor, wherein said fourth transistor and said ninth transistor are configured as a current mirror;
a tenth transistor electrically connected to said ninth transistor;

an eleventh transistor directly electrically connected to said tenth transistor, wherein said tenth transistor and said eleventh transistor are configured as a current mirror; and a twelfth transistor electrically connected to said eleventh transistor;

a first input, wherein said first input is directly electrically connected to a gate of said first transistor;

a second input, wherein said second input is directly electrically connected to a gate of said third transistor;

a first output, wherein said first output is directly electrically connected to a drain of said twelfth transistor and a drain of said eleventh transistor; and a second output, wherein said second output is directly electrically connected to a drain of said eighth transistor and to a drain of said seventh transistor;

wherein said second transistor is electrically connected to said twelfth transistor via one of the following: a direct electrical connection, and a direct electrical connection from said second transistor to a first terminal of a second resistive device and a direct electrical connection from a second terminal of said second resistive device to said twelfth transistor;

wherein said fourth transistor is electrically connected to said eighth transistor via one of the following: a direct electrical connection, and a direct electrical connection from said fourth transistor to a first terminal of a third resistive device and a direct electrical connection from a second terminal of said third resistive device to said eighth transistor; and wherein a gate of each of said seventh transistor, said eighth transistor, said eleventh transistor, and said twelfth transistor are driven by different transistors.

2. The system according to claim 1, wherein said first input and said second input are complementary.

3. The system according to claim 1, wherein said first output and said second output are complementary.

4. The system according to claim 1, further comprising an external power source, wherein a higher voltage potential of said external power source is supplied to a source of each of said second transistor, said fourth transistor, said fifth transistor, said eighth transistor, said ninth transistor, and said twelfth transistor, wherein said second transistor, said fourth transistor, said fifth transistor, said eighth transistor, said ninth transistor, and said twelfth transistor are PMOS.

5. The system according to claim 1, further comprising an external power source, wherein a lower voltage potential of said external power source is supplied to a source of each of said sixth transistor, said seventh transistor, said tenth transistor, said eleventh transistor and said first current source, wherein said first transistor, said third transistor, said sixth transistor, said seventh transistor, said tenth transistor, said eleventh transistor and said first current source are NMOS.

6. The system according to claim 1, wherein a drain of said first current source is directly electrically connected to a source of said first transistor and to a source of said third transistor.

7. The system according to claim 1, wherein a first terminal of said first resistive device is directly electrically connected to a drain of said first current source and a second terminal of said first resistive device is directly electrically connected to a source of said first transistor and to a source of said third transistor.

8. The system according to claim 1, wherein a gate of said second transistor is directly electrically connected to a drain of said second transistor, to a drain of said first transistor, to a gate of said fifth transistor, and to a gate of said twelfth transistor.

9. The system according to claim 1, wherein a first terminal of said second resistive device is directly electrically connected to a gate of said second transistor, to a drain of said second transistor, to a drain of said first transistor, and to a gate of said fifth transistor, wherein a second terminal of said second resistive device is directly electrically connected to a gate of said twelfth transistor.

10. The system according to claim 1, wherein a gate of said fourth transistor is directly electrically connected to a drain of said fourth transistor, to a drain of said third transistor, to a gate of said ninth transistor, and to a gate of said eighth transistor.

11. The system according to claim 1, wherein a first terminal of said third resistive device is directly electrically connected to a gate of said fourth transistor, to a drain of said fourth transistor, to a drain of said third transistor, and to a gate of said ninth transistor wherein said second terminal of said third resistive device is directly electrically connected to a gate of said eighth transistor.

12. The system according to claim 1, wherein a gate of said sixth transistor is directly electrically connected to a drain of said sixth transistor, to a drain of said fifth transistor, and to a gate of said seventh transistor.

13. The system according to claim 1, wherein a gate of said tenth transistor is directly electrically connected to a drain of said tenth transistor, to a drain of said ninth transistor, and to a gate of said eleventh transistor.

14. The system according to claim 1, further comprising a first pull-down device, wherein said first pull-down device is directly electrically connected to said fifth transistor, to said sixth transistors and said seventh transistor.

15. The system according to claim 14, further comprising an external power source, wherein a lower voltage potential of said external power source is supplied to a source of said first pull-down device, wherein a drain of said first pull-down device is directly electrically connected to a drain of said fifth transistor, to a gate of said sixth transistors and to a gate of said seventh transistor and said first pull-down device is NMOS.

16. The system according to claim 1, further comprising a second pull-down device, wherein said second pull-down device is directly electrically connected to said ninth transistor, to said tenth transistors and to said eleventh transistor.

17. The system according to claim 16, further comprising an external power source, wherein a lower voltage potential of said external power source is supplied to a source of said second pull-down device, wherein a drain of said second pull-down device is directly electrically connected to a drain of said ninth transistor, to a gate of said tenth transistor and to a gate of said eleventh transistor and said second pull-down device is NMOS.

18. The system according to claim 1, further comprising a first pull-up device, wherein said first pull-up device is electrically connected to said third transistor, said fourth transistor, said eighth transistor and said ninth transistor.

19. The system according to claim 18, further comprising an external power source, wherein a higher voltage potential of said external power source is supplied to a source of said first pull-up device, wherein a drain of said first pull-up device is directly electrically connected to a gate of said fourth transistor, to a drain of said fourth transistor, to a drain of said third transistor, to a gate of said eighth transistor and to a gate of said ninth transistor and said first pull-up device is PMOS.

20. The system according to claim 18, further comprising an external power source, wherein a higher voltage potential of said external power source is supplied to a source of said first pull-up device, wherein a drain of said first pull-up device is directly electrically connected to a gate of said eighth transistor and to a first terminal of said third resistive device, and a second terminal of said third resistive device is directly electrically connected to a gate of said fourth transistor, to a drain of said fourth transistor, to a drain of said third transistor and to a gate of said ninth transistor and said first pull-up device is PMOS.

21. The system according to claim 1, further comprising a second pull-up device, wherein said second pull-up device is electrically connected to said first transistor, to said second transistor, to said fifth transistor and to said twelfth transistor.

22. The system according to claim 21, further comprising an external power source, wherein a higher voltage potential of said external power source is supplied to a source of said second pull-up device, wherein a drain of said second pull-up device is directly electrically connected to a gate of said second transistor, to a drain of said second transistor, to a drain of said first transistor, to a gate of said fifth transistor and to a gate of said twelfth transistor and second pull-up device is PMOS.

23. The system according to claim 21, further comprising an external power source, wherein a higher voltage potential of said external power source is supplied to a source of said second pull-up device wherein a drain of said second pull-up device is directly electrically connected to a gate of said twelfth transistor and to a first terminal of a said second resistive device, a second terminal of said second resistive device is directly electrically connected to a gate of said second transistor, to a drain of said second transistor, to a drain of said first transistor and to a gate of said fifth transistor wherein said second pull-up device is PMOS.

24. The system according to claim 1, further comprising at least one transistor electrically connected between said first transistor and said second transistor in a cascode arrangement.

25. The system according to claim 1, further comprising at least one transistor electrically connected between said third transistor and said fourth transistor in a cascode arrangement.

26. The system according to claim 1, further comprising at least one transistor electrically connected between said fifth transistor and said sixth transistor in a cascode arrangement.

27. The system according to claim 1, further comprising at least one transistor electrically connected between said seventh transistor and said eighth transistor in a cascode arrangement.

28. The system according to claim 1, further comprising at least one transistor electrically connected between said ninth transistor and said tenth transistor in a cascode arrangement.

29. The system according to claim 1, further comprising at least one transistor electrically connected between said eleventh transistor and said twelfth transistor in a cascode arrangement.

30. The system according to claim 1, further comprising a thirteenth transistor and a fourteenth transistor electrically connected between said first transistor and said second transistor, wherein said thirteenth transistor is NMOS and said fourteenth transistor is PMOS, and said thirteenth transistor and said first transistor are cascoded, and said fourteenth transistor is directly electrically connected with said second transistor and with said thirteenth transistor.

31. The system according to claim 1, further comprising a fifteenth transistor and a sixteenth transistor electrically connected between said third transistor and said fourth transistor, wherein said fifteenth transistor is NMOS and said sixteenth transistor is PMOS, and said fifteenth transistor and said third transistor are cascoded, and said sixteenth transistor and is directly electrically connected with said fourth transistor and said fifteenth transistor.

32. The system according to claim 1, further comprising a seventeenth transistor and an eighteenth transistor electrically connected between said fifth transistor and said sixth transistor, wherein said seventeenth transistor is NMOS and said eighteenth transistor is PMOS, said fifth transistor and said eighteenth transistor are cascoded, and said seventeenth transistor is directly electrically connected with said sixth transistor and said eighteenth transistor.

33. The system according to claim 1, further comprising a nineteenth transistor and a twentieth transistor electrically connected between said seventh transistor and said eighth transistor, wherein said nineteenth transistor is NMOS and said twentieth transistor is PMOS and said nineteenth transistor and said seventh transistor are cascoded and said eighth transistor and said twentieth transistor are cascoded.

34. The system according to claim 1, further comprising a twenty-first transistor and a twenty-second transistor electrically connected between said ninth transistor and said tenth transistor, wherein said twenty-first transistor is NMOS and said twenty-second transistor is PMOS, and wherein said ninth transistor and said twenty-second transistor are cascoded, and said twenty-first transistor is directly electrically connected with said tenth transistor and said twenty-second transistor.

35. The system according to claim 1, further comprising a twenty-third transistor and a twenty-fourth transistor directly electrically connected between said eleventh transistor and said twelfth transistor, wherein said twenty-third transistor is NMOS and said twenty-fourth transistor is PMOS, and said twelfth transistor and said twenty-fourth transistor are cascoded, and said twenty-third transistor and said eleventh transistor are cascoded.

36. A method for implementing a transistor circuit, comprising:

electrically connecting a differential input stage to a first differential output stage and to a second differential output stage, wherein for said differential input stage:
  electrically connecting a first current source to a first transistor via one of the following: a direct electrical connection, and a direct electrical connection from said first current source to a first terminal of a first resistive device and a direct electrical connection from a second terminal of said first resistive device to said first transistor;
  electrically connecting a second transistor to said first transistor;
  electrically connecting a third transistor to said first current source via one of the following: a direct electrical connection, and a direct electrical connection from said first current source to a first terminal of a first resistive device and a direct electrical connection from a second terminal of said first resistive device to said third transistor; and
  electrically connecting a fourth transistor to said third transistor;
wherein for said first differential output stage:
  directly electrically connecting a fifth transistor to said second transistor, wherein said second transistor and said fifth transistor are configured as a current mirror;
  electrically connecting a sixth transistor to said fifth transistor;

directly electrically connecting a seventh transistor to said sixth transistor, wherein said sixth transistor and said seventh transistor are configured as a current mirror; and electrically connecting an eighth transistor to said seventh transistor;

wherein for said second differential output stage:

directly electrically connecting a ninth transistor to said fourth transistor, wherein said fourth transistor and said ninth transistor are configured as a current mirror;

electrically connecting a tenth transistor to said ninth transistor;

directly electrically connecting an eleventh transistor to said tenth transistor, wherein said tenth transistor and said eleventh transistor are configured as a current mirror; and electrically connecting a twelfth transistor to said eleventh transistor;

electrically connecting said second transistor to said twelfth transistor via one of the following: a direct electrical connection, and a direct electrical connection from said second transistor to a first terminal of a second resistive device and a direct electrical connection from a second terminal of said second resistive device to said twelfth transistor: and electrically connecting said fourth transistor to said eighth transistor via one of the following: a direct electrical connection, and a direct electrical connection from said fourth transistor to a first terminal of a third resistive device and a direct electrical connection from a second terminal of said third resistive device to said eighth transistor directly electrically connecting a first input to a gate of said first transistor;

directly electrically connecting a second input to a gate of said third transistor;

directly electrically connecting a first output to a drain of said twelfth transistor and a drain of said eleventh transistor;

directly electrically connecting a second output to a drain of said eighth transistor and to a drain of said seventh transistor; and wherein a gate of each of said seventh transistor, said eighth transistor, said eleventh transistor, and said twelfth transistor are driven by different transistors.

37. The method according to claim 36, wherein said first input and said second input are complementary.

38. The method according to claim 36, wherein said first output and said second output are complementary.

39. The method according to claim 36, further comprising supplying a higher voltage potential of an external power source to a source of each of said second transistor, said fourth transistor, said fifth transistor, said eighth transistor, said ninth transistor, and said twelfth transistor, wherein said second transistor, said fourth transistor, said fifth transistor, said eighth transistor, said ninth transistor, and said twelfth transistor are PMOS.

40. The method according to claim 36, further comprising supplying a lower voltage potential of an external power source to a source of each of said sixth transistor, said seventh transistor, said tenth transistor, said eleventh transistor and said first current source, wherein said first transistor, said third transistor, said sixth transistor, said seventh transistor, said tenth transistor, said eleventh transistor and said first current source are NMOS.

41. The method according to claim 36, further comprising directly electrically connecting a drain of said first current source to a source of said first transistor and to a source of said third transistor.

42. The method according to claim 36, further comprising:

directly electrically connecting a first terminal of said first resistive device to a drain of said first current source; and directly electrically connecting a second terminal of said first resistive device to a source of said first transistor and to a source of said third transistor.

43. The method according to claim 36, further comprising directly electrically connecting a gate of said second transistor to a drain of said second transistor, to a drain of said first transistor, to a gate of said fifth transistor, and to a gate of said twelfth transistor.

44. The method according to claim 36, further comprising:

directly electrically connecting a gate of said second transistor to a drain of said second transistor, to a drain of said first transistor, to a gate of said fifth transistor, and to a first terminal of said second resistive device; and directly electrically connecting a second terminal of said second resistive device to a gate of said twelfth transistor.

45. The method according to claim 36, further comprising directly electrically connecting a gate of said fourth transistor to a drain of said fourth transistor, to a drain of said third transistor, to a gate of said ninth transistor, and to a gate of said eighth transistor.

46. The method according to claim 36, further comprising:

directly electrically connecting a gate of said fourth transistor to a drain of said fourth transistor, to a drain of said third transistor, to a gate of said ninth transistor, and to a first terminal of said third resistive device; and directly electrically connecting a second terminal of said third resistive device to a gate of said eighth transistor.

47. The method according to claim 36, further comprising directly electrically connecting a gate of said sixth transistor to a drain of said sixth transistor, to a drain of said fifth transistor, and to a gate of said seventh transistor.

48. The method according to claim 36, further comprising directly electrically connecting a gate of said tenth transistor to a drain of said tenth transistor, to a drain of said ninth transistor, and to a gate of said eleventh transistor.

49. The method according to claim 36, further comprising directly electrically connecting a first pull-down device to said sixth transistor and said seventh transistor.

50. The method according to claim 49, further comprising:

supplying a lower voltage potential of an external power source to a source of said first pull-down device; and directly electrically connecting a drain of said first pull-down device to a gate of said sixth transistor and to a gate of said seventh transistor wherein said first pull-down device is NMOS.

51. The method according to claim 36, further comprising directly electrically connecting a second pull-down device to said tenth transistor and to said eleventh transistor.

52. The method according to claim 51, further comprising:

supplying a lower voltage potential of an external power source to a source of said second pull-down device; and directly electrically connecting a drain of said second pull-down device to a gate of said tenth transistor and to a gate of said eleventh transistor wherein said second pull-down device is NMOS.

53. The method according to claim 36, further comprising electrically connecting a first pull-up device to said third transistor, said fourth transistor, said eighth transistor and said ninth transistor.

54. The method according to claim 53, further comprising:
supplying a higher voltage potential of an external power source to a source of said first pull-up device; and
directly electrically connecting a drain of said first pull-up device to a gate of said fourth transistor, to a drain of said fourth transistor, to a drain of said third transistor, to a gate of said eighth transistor and to a gate of said ninth transistor, wherein said first pull-up device is PMOS.

55. The method according to claim 53, further comprising:
supplying a higher voltage potential of said external power source to a source of said first pull-up device;
directly electrically connecting a drain of said first pull-up device to a gate of said eighth transistor and to a first terminal of said third resistive device; and
directly electrically connecting a second terminal of said third resistive device to a gate of said fourth transistor, to a drain of said fourth transistor, to a drain of said third transistor and to a gate of said ninth transistor, wherein said first pull-up device is PMOS.

56. The method according to claim 36, further comprising electrically connecting a second pull-up device to said first transistor to said second transistor, to said fifth transistor and to said twelfth transistor.

57. The method according to claim 56, further comprising:
supplying a higher voltage potential of an external power source to a source of said second pull-up device; and
directly electrically connecting a drain of said second pull-up device to a gate of said second transistor, to a drain of said second transistor, to a drain of said first transistor, to a gate of said fifth transistor and to a gate of said twelfth transistor, wherein said second pull-up device is PMOS.

58. The method according to claim 56, further comprising:
supplying a higher voltage potential of said external power source to a source of said second pull-up device;
directly electrically connecting a drain of said second pull-up device to a gate of said twelfth transistor and to a first terminal of said second resistive device; and
directly electrically connecting a second terminal of said second resistive device to a gate of said second transistor, to a drain of said second transistor, to a drain of said first transistor and to a gate of said fifth transistor, wherein said second pull-up device is PMOS.

* * * * *